(12) United States Patent
Wu et al.

(10) Patent No.: US 10,303,571 B2
(45) Date of Patent: May 28, 2019

(54) DATA RECOVERY IN MEMORY DEVICES

(71) Applicant: Intel Corporation, Santa Clara, CA (US)

(72) Inventors: Ning Wu, Folsom, CA (US); Xin Guo, San Jose, CA (US); Ramkarthik Ganesan, Folsom, CA (US); Pranav Kalavade, San Jose, CA (US); Robert Frickey, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/932,870

(22) Filed: Nov. 4, 2015

(65) Prior Publication Data
US 2017/0123946 A1 May 4, 2017

(51) Int. Cl.
| | |
|---|---|
| *G06F 11/00* | (2006.01) |
| *G06F 11/20* | (2006.01) |
| *G06F 12/02* | (2006.01) |
| *G06F 11/14* | (2006.01) |

(Continued)

(52) U.S. Cl.
CPC ........ *G06F 11/2094* (2013.01); *G06F 11/141* (2013.01); *G06F 11/1441* (2013.01); *G06F 12/0238* (2013.01); *G06F 12/0804* (2013.01); *G06F 12/0868* (2013.01); *G06F 2201/805* (2013.01); *G06F 2212/1016* (2013.01); *G06F 2212/1032* (2013.01); *G06F 2212/1044* (2013.01); *G06F 2212/1048* (2013.01); *G06F 2212/214* (2013.01); *G06F 2212/222* (2013.01); *G06F 2212/7203* (2013.01); *G06F 2212/7204* (2013.01); *G06F 2212/7211* (2013.01); *G11C 2211/5641* (2013.01)

(58) Field of Classification Search
CPC .................. G06F 11/2094; G06F 2201/805
USPC ........................................... 714/6.21
See application file for complete search history.

(56) References Cited

U.S. PATENT DOCUMENTS

| | | | | |
|---|---|---|---|---|
| 6,462,992 B2 * | 10/2002 | Harari | .................. | G06F 3/0601 365/185.19 |
| 10,037,160 B2 * | 7/2018 | Kong | .................... | G06F 3/0631 |

(Continued)

OTHER PUBLICATIONS

International search report for PCT patent application No. PCT/US16/55076 filed Oct. 1, 2016; dated Dec. 23, 2016; 13 pages.

*Primary Examiner* — Yair Leibovich
(74) *Attorney, Agent, or Firm* — Thorpe North & Western, LLP

(57) ABSTRACT

Technology for an apparatus is described. The apparatus can include a first non-volatile memory, a second non-volatile memory to have a write access time faster than the first non-volatile memory, and a memory controller. The memory controller can be configured to detect corrupted data in a selected data region in the first non-volatile memory. The selected data region can be associated with an increased risk of data corruption after data is written from the second non-volatile memory to the first non-volatile memory. Uncorrupted data in the second non-volatile memory that corresponds to the corrupted data in the first non-volatile memory can be identified. Data recovery in the first non-volatile memory can be performed by replacing the corrupted data in the first non-volatile memory with uncorrupted data from the second non-volatile memory.

23 Claims, 10 Drawing Sheets

(51) Int. Cl.
*G06F 12/0804* (2016.01)
*G06F 12/0868* (2016.01)

(56) References Cited

U.S. PATENT DOCUMENTS

| | | | |
|---|---|---|---|
| 2003/0037295 A1* | 2/2003 | Galzur | G11C 29/38 714/719 |
| 2005/0097406 A1* | 5/2005 | Brebisson | G06F 11/1666 714/52 |
| 2006/0259718 A1 | 11/2006 | Paley | |
| 2007/0208904 A1 | 9/2007 | Hsieh et al. | |
| 2010/0318721 A1 | 12/2010 | Avila et al. | |
| 2014/0281808 A1* | 9/2014 | Lam | G06F 11/1048 714/764 |
| 2015/0012802 A1* | 1/2015 | Avila | G06F 12/0246 714/773 |
| 2015/0092487 A1 | 4/2015 | Phan | |
| 2017/0123685 A1* | 5/2017 | Zuo | G06F 3/065 |
| 2018/0217751 A1* | 8/2018 | Agarwal | G06F 3/0616 |

\* cited by examiner

| Memory Device | | ~510 |
|---|---|---|
| Die Counts | 4 | |
| Max Physical Capacity | 268.9 | |
| - Defect Management – 2% Defects | 5.4 | |
| - System (GB in bin) | 3.7 | |
| - SLC Cache (GB in bin) | (9.0) | |
| - XOR (GB in bin) | 16.0 | |
| - Spare (GB in bin): 4% | 8.4 | |
| Capacity Available (GB in bin) | 226.46 | |
| Capacity Available (GB in dec) | 243.2 | |

Additional 16 GB Capacity

| Memory Device | | ~520 |
|---|---|---|
| Die Counts | 4 | |
| Max Physical Capacity | 268.9 | |
| - Defect Management – 2% Defects | 5.4 | |
| - System (GB in bin) | 3.7 | |
| - SLC Cache (GB in bin) | 9.0 | |
| - XOR (GB in bin) | (0.0) | |
| - Spare (GB in bin): 4% | 8.4 | |
| Capacity Available (GB in bin) | 242.46 | |
| Capacity Available (GB in dec) | 260.4 | |

FIG. 5

DATA RECOVERY IN MEMORY DEVICES

BACKGROUND

Memory devices are typically provided as internal, semiconductor, integrated circuits in computers or other electronic devices. There are many different types of memory including volatile memory, for example, dynamic random access memory (DRAM) and synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others. The uses for such memory continue to expand.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein:

FIG. 5 illustrates storage savings obtained when an XOR protocol is not utilized to perform data recovery in a data storage device in accordance with an example embodiment;

Figure 1:
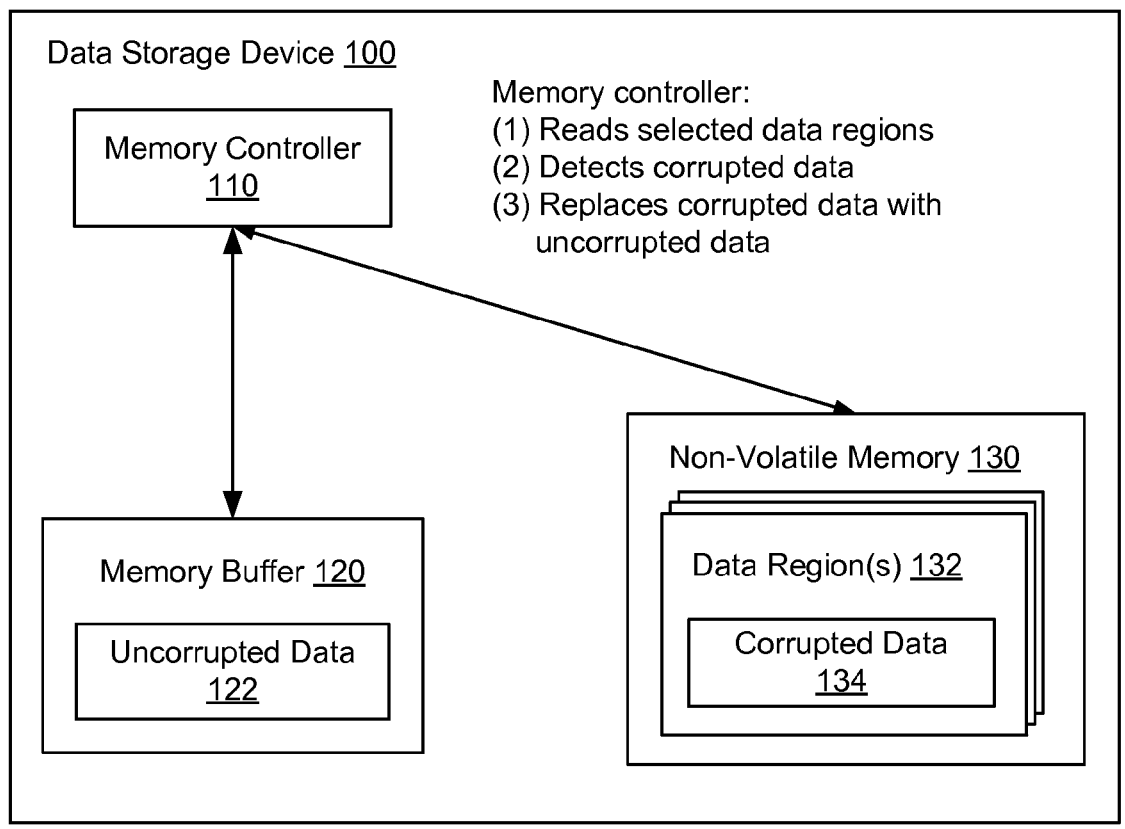
FIG. 1 illustrates a data storage device in accordance with an example embodiment.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this specification and the appended claims, the singular forms "a," "an" and "the" include plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

EXAMPLE EMBODIMENTS

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

Solid state drives (SSD)s utilize non-volatile memory (NVM), such as non-volatile NAND-based flash memory, which can retain data without power to persistently store data. Other examples of non-volatile memory (NVM) include, but are not limited to, phase change memory, ferroelectric memory, magnetoresistive memory, etc.

As the performance and complexity of electronic systems increase, the requirement for additional memory in a system also increases. However, it is desirable that the parts count be minimized in order to continue to reduce the costs of the system. This can be accomplished by increasing the memory density of an integrated circuit by using such technologies as multilevel cells (MLC). For example, MLC NAND flash memory is a very cost effective non-volatile memory.

MLC NAND can take advantage of the analog nature of a traditional flash cell by assigning a data state, e.g., a bit pattern, to a specific threshold voltage (Vt) range of the cell. This can permit the storage of two or more bits of information per cell, depending on the quantity of voltage ranges assigned to the cell and the stability of the assigned voltage ranges during the lifetime operation of the memory cell.

While MLC NAND has the advantage of effectively increasing memory capacity and density, MLC NAND often suffers from lower read/write speed and increased error rate compared to Single level cell (SLC) NAND. As a result, data recovery operations are often necessary in MLC NAND flash memory devices. Unfortunately, most recovery operations, for example an Exclusive OR (XOR) protocol, further slow the overall memory read/write process and take up valuable space in the memory.

Cost can be a critical factor for consumers of client SSDs, for example, a SSD used in a laptop. As a result, a majority of client SSDs include MLC non-volatile memory devices, (e.g. three level cell (TLC) NAND). In TLC NAND, three bits of information are stored per cell in the NAND. In addition, client SSDs can include a memory buffer to boost performance of the client SSD. The memory buffer can utilize single level cell (SLC) non-volatile memory (e.g., SLC NAND), in which one bit of information is stored per cell in the NAND. In one example, the TLC NAND region of the SSD can be referred to as non-volatile memory, and an SLC NAND region of the SSD can be referred to as the memory buffer.

In one protocol, in order to write data to the non-volatile memory in the client SSD, the data is first written to the memory buffer and then from the memory buffer to the non-volatile memory, which can boost performance due to increased transfer speeds in writing to the memory buffer. Since a client device generally writes only a few gigabytes (GBs) of data at a time to the client SSD, the SLC-based non-volatile memory buffer (e.g., 3 GB in capacity) can improve write burst performance of the client SSD.

Because of the potential for data errors in writing information into the non-volatile memory (e.g., the TLC NAND region of the SSD), the client SSD may allocate additional capacity for a protection protocol, such as an XOR protocol to protect against data defects (i.e., for data integrity) in the non-volatile memory. In other words, the XOR protocol can allocate additional data or additional spares to be used for data recovery in the non-volatile memory, thereby addressing an increasing number of extrinsic defects (e.g., circuit opens/shorts) in the client SSD. The XOR protocol uses an extra plane (or die) in the non-volatile memory and/or the memory buffer of the client SSD, and if corrupted data is detected in the non-volatile memory, then the data can be reassembled using the XOR protocol. Generally speaking, a protocol such as the XOR protocol is vital since data defects can corrupt the data stored on the client SSD. However, as the capacity of client SSDs increases over time, the amount of resources to be dedicated to the XOR protocol must also be increased. As a non-limiting example, the amount of resources on a client SSD that must be dedicated to a XOR protocol can range from 12-16 GB, which can be a significant portion of the client SSD's overall capacity.

Accordingly, provided herein are technologies for performing data recovery in a client SSD (i.e., a non-volatile memory device), such as a NAND memory device. More specifically, the client SSD can perform the data recovery by replacing corrupted data in a non-volatile memory of the client SSD with corresponding uncorrupted data in a memory buffer of the client SSD. The client SSD can perform the data recovery by utilizing data stored in the memory buffer, as opposed to using an XOR protocol to recover (i.e. reassemble) the corrupted data in the non-volatile memory. As explained in further detail below, in one configuration, data recovery can be performed using a read back feature, in which selected data regions (e.g., pages) of the non-volatile memory that are known to be associated with relatively high failure rates are read by the memory controller, and when identified as corrupted, the data in the non-volatile memory can be replaced with uncorrupted data from the memory buffer. In one embodiment, data recovery can be performed using a detection feature, such as a high pulse warning detection feature or a low pulse warning detection feature to detect corrupted data which is then replaced with uncorrupted data from the memory buffer.

The aforementioned general processes, as well as the embodiments thereof described herein present an attractive alternative mechanism for replacing corrupted data in the non-volatile memory of a client SSD with uncorrupted data from the memory buffer, as opposed to using an XOR protocol, or other data reassembly protocol, to recover corrupted data in the non-volatile memory. Previous uses of the memory buffer were directed primarily to boost performance while an XOR protocol was used to maintain data integrity. As disclosed herein, in some embodiments, the memory buffer is used for both performance enhancement and data integrity and the XOR protocol is eliminated. Since the memory buffer is already present in the client SSD, it is more efficient to perform data recovery using the existing memory buffer and eliminate the XOR protocol from the non-volatile memory altogether.

In one example, a data recovery operation involving the memory buffer (as opposed to the XOR protocol) can be performed using aread back feature and/or a high/low pulse warning detection feature. The read back feature and the high/low pulse warning detection feature can each be used alone, or can be complementary features used in combination to perform data recovery in the non-volatile memory. The significant amount of storage that is saved by eliminating the XOR protocol in the client SSD can provide additional storage capacity to the client. In addition, the elimination of the XOR protocol for recovering data in the non-volatile memory can provide a more cost effective solution when dealing with data corruption in the client SSD.

In one example, the non-volatile memory and/or the memory buffer can, be a phase change memory (PCM), a three dimensional cross point memory, a resistive memory, nanowire memory, ferro-electric transistor random access memory (FeTRAM), flash memory such as NAND or NOR, magnetoresistive random access memory (MRAM) memory that incorporates memristor technology, and/or spin transfer torque (STT)-MRAM.

FIG. 1 illustrates an exemplary data storage device 100. The data storage device 100 can be a solid state drive (SSD). The data storage device 100 can include a memory controller 110, a memory buffer 120 and a non-volatile memory 130. In one configuration, the memory controller 110 can utilize a read back feature when performing data recovery in the non-volatile memory 130. The read back feature can be used to ensure data integrity in the data storage device 100. A protocol for implementing the read back feature can be stored in the memory controller 110. The memory buffer 120 and/or the non-volatile memory 130 can utilize NAND, phase change memory, etc. In one specific example, the memory buffer 120 can utilize single level cell (SLC)-based NAND technology and the non-volatile memory 130 can utilize three level cell (TLC)-based NAND technology or multi-level cell (MLC)-based NAND technology. In other words, the memory buffer 120 can utilize one bit per cell of non-volatile storage media (i.e., one bit per cell in the NAND), and the non-volatile memory 130 can utilize three bits per cell of non-volatile storage media (i.e., three bits per cell in the NAND).

In one example, the memory controller 110 can write data from the memory buffer 120 to the non-volatile memory 130. The memory buffer 120 may be utilized when writing data (or programming data) to the non-volatile memory 130 in order to boost performance. After data is written from the memory buffer 120 to the non-volatile memory 130, the memory controller 110 can proactively check the non-volatile memory 130 for corrupted data 134 by selectively reading a data region 132 (e.g., a specific page or a plurality of pages in a block) in the non-volatile memory 130. Hence, the memory controller 110 can implement the read back feature to check for corrupted data 134. As an example, the memory controller 110 can execute a block program to write data in a particular block of the non-volatile memory 130, and at the end of the block program, the memory controller 110 can proactively check for corrupted data 134 by reading one or more pages in the particular block of the non-volatile memory 130.

In one example, the memory controller 110 can selectively read the data region 132 (e.g., one or more pages of a particular block) in the non-volatile memory 130 based on prior knowledge of data corruption or likelihood of data corruption in data storage devices. For example, the memory controller 110 can select data regions 132 in the non-volatile memory 130 that are prone or susceptible to an increased likelihood of data corruption. In other words, the memory controller 110 can select data regions 132 with a failure rate that is known or suspected to be above a defined threshold. Such prior knowledge or suspicion can be generated using development and testing information associated with the data storage device 100, and then the prior knowledge can be used in programmed the memory controller 110. In one embodiment, prior knowledge or suspicion can be obtained and implemented on a device-by-device basis, with information programmed into the memory controller 110 of the actual device that was tested. In another embodiment, prior knowledge or suspicion can be obtained and implemented on a device-type or product-type basis with information programmed into the memory controller 110 which was obtained from testing of a device of the same or similar type. In yet a further embodiment, the prior knowledge or suspicion can be obtained and implemented on a general basis with information programmed into the memory controller 110 which was obtained through application of generally known principles or theories of memory production and operation. Therefore, based on the prior knowledge, the memory controller 110 can proactively and selectively read certain data regions 132 (i.e. preselected data regions) in the non-volatile memory 130 after data is written from the memory buffer 120 to data regions 132 in the non-volatile memory 130.

As a non-limiting example, edge pages of a block can be associated with a failure rate that is above a defined threshold, and therefore, the memory controller 110 can selectively read the edge pages of the block at the end of the block program. As another non-limiting example, pages that correspond to the transition of word line groups can be associated with a failure rate that is above the defined threshold. For example, NAND internal trim settings are grouped into word line groups, and the transitions between these word line groups can also be susceptible to error. As yet another non-limiting example, upper pages of a block can be associated with a failure rate that is above the defined threshold. In still another non-limiting example, special word lines (e.g., SLC/MLC NAND word lines in a TLC NAND block of the non-volatile memory 130) can be associated with a failure rate that is above the defined threshold. As an additional non-limiting example, edge blocks can be associated with a failure rate that is above the defined threshold.

In one example, the memory controller 110 can write data to the pages in the block in accordance with the block program, and then proactively and selectively read back some (or all) of the pages (e.g., edge pages, upper pages) in the block based on which of the pages are more susceptible to data corruption.

In one example, the memory controller 110 can detect corrupted data 134 when reading the selected data region 132 in the non-volatile memory 130 (i.e., reading data regions 132 that are more prone to data corruption). More specifically, when the memory controller 110 reads data that is corrupted, an "error correcting code (ECC) uncorrectable" response can be triggered, thereby indicating to the memory controller 110 that the data is corrupted. If such a response is not triggered when the memory controller 110 reads the selected data region 132, then the memory controller 110 may not detect any corrupted data 134 in the selected data region 132 in the non-volatile memory 130.

In some cases, since the memory controller 110 may not read data regions 132 in the non-volatile memory 130 that are not prone to data corruption, the memory controller 110 may overlook certain data regions 132 in the non-volatile memory 130 that include corrupted data 134. However, by the memory controller 110 reading the data regions 132 that are most likely to include corrupted data 134, the memory controller 110 may be able to detect a majority of the corrupted data 134 in the non-volatile memory 130.

In one example, when the memory controller 110 detects corrupted data 134 in the selected data region 132 in the non-volatile memory 130, the memory controller 110 can identify uncorrupted data 122 in the memory buffer 120 that corresponds to the corrupted data 134 in the non-volatile memory 130. Then, the memory controller 110 can perform data recovery in the non-volatile memory 130 by replacing the corrupted data 134 in the non-volatile memory 130 with the corresponding uncorrupted data 122 from the memory buffer 120. Thus, the data recovery can be triggered from the memory buffer 120. In other words, the memory controller 110 can rewrite the uncorrupted data 122 from the memory buffer 120 to the non-volatile memory 130 in place of the corrupted data 134 in the non-volatile memory 130.

In one configuration, the memory controller 110 can discard data in the memory buffer 120 after the selected data regions 132 in the non-volatile memory 130 are read, and no corrupted data 134 is detected in the selected data regions 132 in the non-volatile memory 130. In other words, the data in the memory buffer 120 can be discarded after the read back feature is successfully performed. Alternatively, the memory controller 110 can discard the uncorrupted data 122 in the memory buffer 120 after the uncorrupted data 122 is written over the corrupted data 134 in the non-volatile memory 130 in response to detection of the corrupted data 134 in the non-volatile memory 130.

Figure 2:
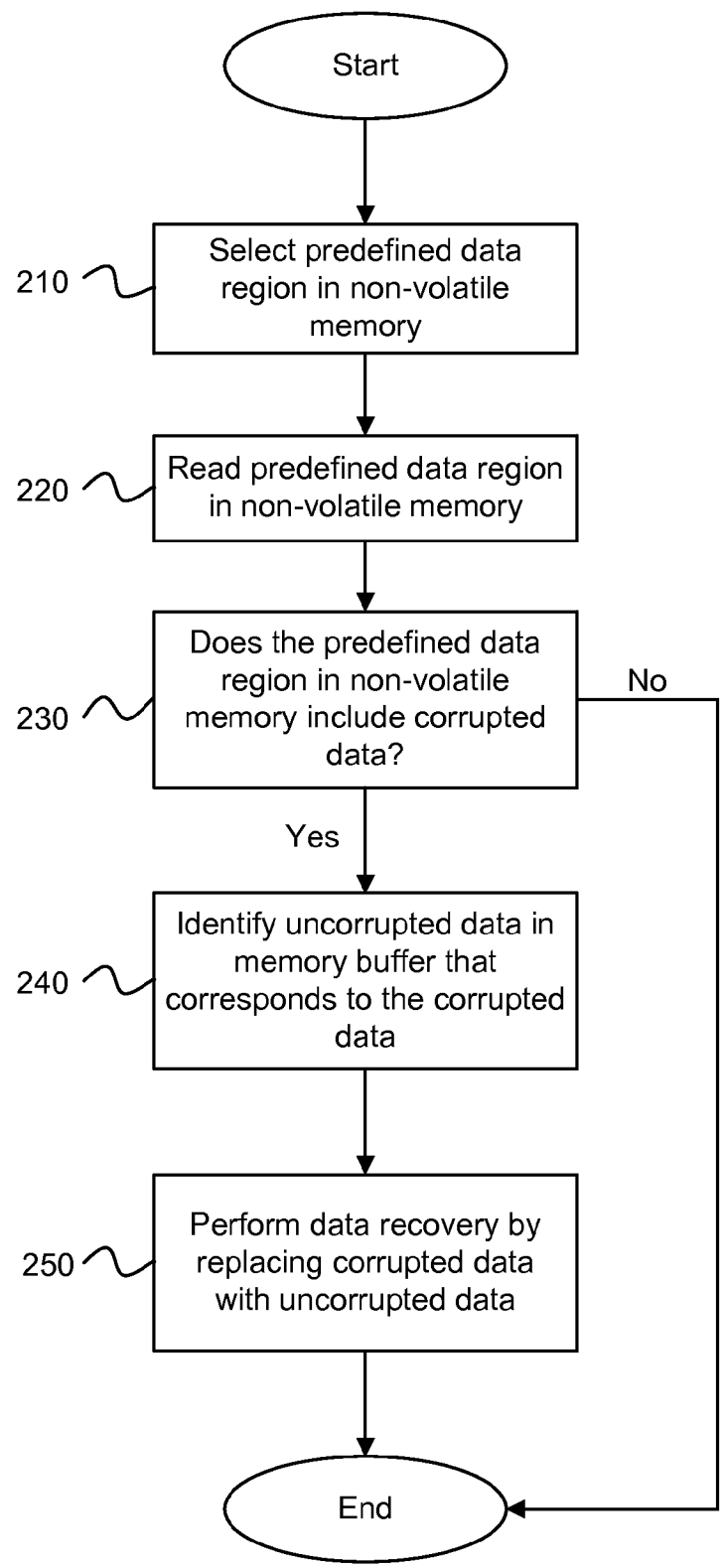
FIG. 2 illustrates a technique to perform data recovery in a data storage device in accordance with an example embodiment.

FIG. 2 illustrates an exemplary technique to perform data recovery in a data storage device (e.g., NAND memory device). The data storage device can include a memory buffer, a non-volatile memory, and a memory controller that writes data from the memory buffer to the non-volatile memory. In step 210, a predefined data region (e.g., a particular page or a plurality of pages in a block) can be selected in the non-volatile memory. The predefined data region can be a data region that is prone or susceptible to data corruption. In other words, the predefined data region can be associated with a relatively high failure rate. In step 220, the predefined data region in the non-volatile memory (i.e., the data region that is at an increased risk for data corruption) can be read by, for example, the memory controller. In step 230, based on the reading, the memory controller can determine whether the predefined data region in the non-volatile memory includes corrupted data. If the predefined data region in the non-volatile memory includes corrupted data, in step 240, the memory controller can identify uncorrupted data in the memory buffer that corresponds to the corrupted data in the non-volatile memory. In step 250, the memory buffer can perform a data recovery procedure by replacing the corrupted data in the non-volatile memory with the uncorrupted data from the memory buffer.

Figure 3:
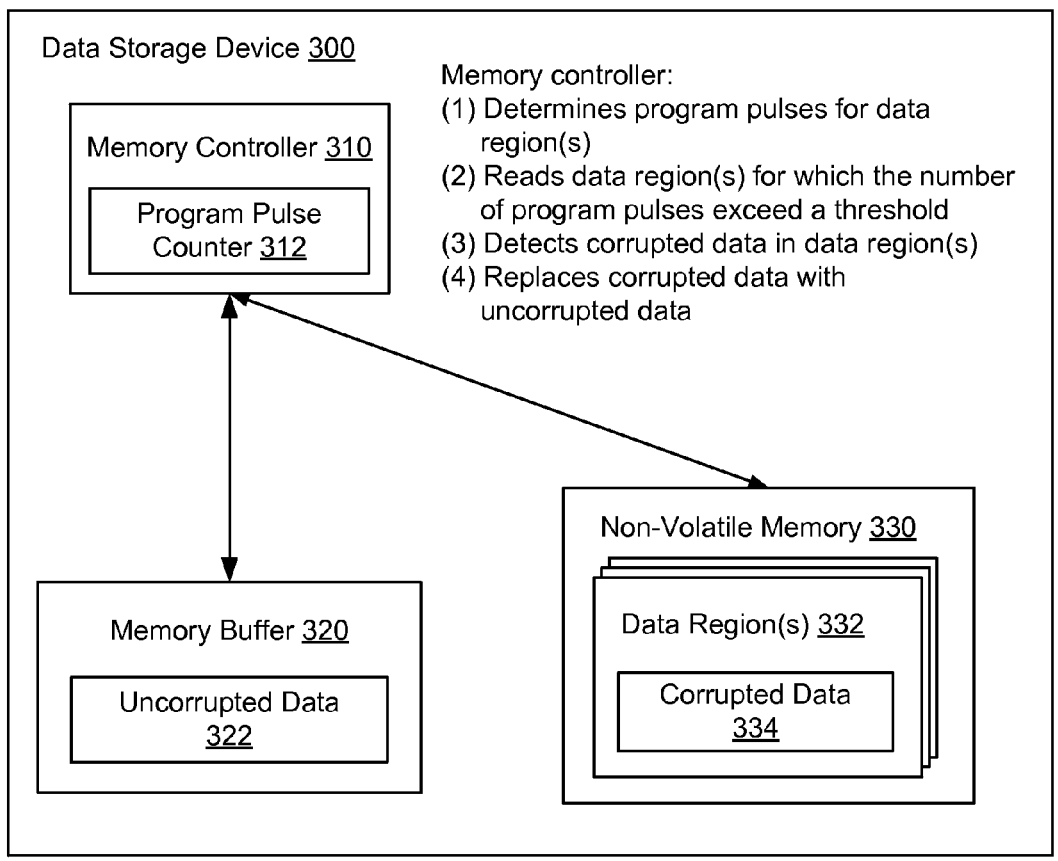
FIG. 3 illustrates a data storage device in accordance with an example embodiment.

FIG. 3 illustrates an exemplary data storage device 300. The data storage device 300 can be a non-volatile memory solid state drive (SSD). The data storage device 300 can include a memory controller 310, a memory buffer 320 and a non-volatile memory 330. In one configuration, the memory controller 310 can utilize a high pulse warning detection feature and/or a low pulse warning detection feature when performing data recovery in the non-volatile memory 330. The high/low pulse warning detection feature can be used to ensure data integrity in the data storage device 300. A protocol for implementing the high/low pulse warning detection feature can be stored in the memory controller 310. The memory buffer 320 and/or the non-volatile memory 330 can utilize NAND, phase change memory, etc. In one specific example, the memory buffer 320 can utilize single level cell (SLC)-based NAND technology and the non-volatile memory 330 can utilize three level cell (TLC)-based NAND technology. In other words, the memory buffer 320 can utilize one bit per cell of non-volatile storage media (e.g., one bit per cell in the NAND), and the non-volatile memory 330 can utilize three bits per cell of non-volatile storage media (e.g., three bits per cell in the NAND).

In one example, the memory controller 310 can write data from the memory buffer 320 to the non-volatile memory 330. The memory buffer 320 may be utilized when writing data (or programming data) to the non-volatile memory 330 in order to boost performance. As explained in further detail below, even after the data is copied from the memory buffer 320 to the non-volatile memory 330, the data can be maintained in the memory buffer 320 until the high/low pulse warning detection feature is successfully completed.

After data is written from the memory buffer 320 to the non-volatile memory 330, the memory controller 310 can determine, via a program pulse counter 312, a number of program pulses applied to a defined data region 332 of the non-volatile memory 330. The program pulses can be applied to the defined data region 332 (e.g., specific memory cells) in order to program data in the defined data region 332 of the non-volatile memory 330. Therefore, the program pulse counter 312 can count the number of program pulses for a particular data region 332 when data is being written to that particular data region 332. As a non-limiting example, the memory controller 310 can determine, via the program pulse counter 312, the number of program pulses applied to a particular page in a block of the non-volatile memory 330.

In one example, the memory controller 310 can determine whether the number of program pulses for the defined data region 332 (e.g., a particular page in a block of the non-volatile memory 330) is above a defined threshold. The number of program pulses can refer to a number of times that data is programmed (or written) in the defined data region 332. In other words, the memory controller 310 can detect whether the number of pulses for the defined data region 332 triggers a high pulse warning (i.e. has been programmed or written to a number of times that is above the defined threshold). The defined threshold can be previously set, and may be dependent on a type of page in the block of the non-volatile memory 330. For example, the threshold can be set higher or lower for certain types of pages (e.g., edge pages) in the non-volatile memory 330 as compared to other types of pages in the non-volatile memory 330. In one example, for each data region 332 (e.g., page) in the non-volatile memory 330, the memory controller 310 can determine whether or not the number of program pulses for that particular region exceeds the defined threshold.

In another example, the memory controller 310 can determine whether the number of program pulses for the defined data region 332 (e.g., a particular page in a block of the non-volatile memory 330) is below a defined threshold. In particular, the memory controller 310 can detect whether the number of pulses for the defined data region 332 triggers a low pulse warning. The low pulse warning can indicate that the defined data region 332 is associated with a number of program pulses that are below a defined threshold.

In one example, a high program pulse count or a low program pulse count associated with a particular data region 332 (e.g., page) can be indicative of possible data corruption in that particular data region 332. Specifically, a high program pulse count or a low program pulse count can indicate an increased probability of data corruption in that particular data region 332. In one example, a high number of program pulses can lead to an increased amount of voltage on a word line, which can corrupt other memory cells of the non-volatile memory 330 that are on the same word line. The corruption of the other memory cells can possibly lead to corruption of the data stored in those memory cells.

Therefore, the memory controller 310 can identify each data region 332 (e.g., page) in which the number of program pulses is above (or below) a defined threshold, and then the memory controller 310 can read the identified data region 332 in order to proactively check for corrupted data 334 in the data region 332. For example, when reading the defined data region 332 in the non-volatile memory 330 (e.g., reading a data region 332 that is more prone to data corruption due to the high/low program pulse count associated with the data region 332), the memory controller 310 can detect corrupted data 334 in the defined data region 332 in the non-volatile memory 330. More specifically, when the memory controller 310 reads data that is corrupted, an "error correcting code (ECC) uncorrectable" response can be triggered, thereby indicating to the memory controller 310 that the data is corrupted. If such a response is not triggered when the memory controller 310 reads the selected data region 332, then the memory controller 310 may not detect any corrupted data 334 in the defined data region 332 in the non-volatile memory 330.

In one example, when the memory controller 310 detects corrupted data 334 in the defined data region 332 in the non-volatile memory 330, the memory controller 310 can identify uncorrupted data 322 in the memory buffer 320 that corresponds to the corrupted data 334 in the non-volatile memory 330. Then, the memory controller 310 can perform data recovery in the non-volatile memory 330 by replacing the corrupted data 334 in the non-volatile memory 330 with uncorrupted data 322 from the memory buffer 320. Thus, the data recovery can be triggered from the memory buffer 320. Specifically, the memory controller 310 can rewrite the uncorrupted data 322 from the memory buffer 320 to the non-volatile memory 330 in place of the corrupted data 334 in the non-volatile memory 330.

In one example, when the program pulse count for a particular data region 332 is not above the defined region, the memory controller 310 may determine to not proactively read the data region 332 in order to check for corrupted data 334. Therefore, in some cases, it may be possible for the memory controller 310 to overlook corrupted data 334 in data regions 332 that are not associated with a high program pulse count. However, by the memory controller 310 reading the data regions 332 that are most likely to include corrupted data 334, the memory controller 310 may be able to detect a majority of the corrupted data 334 in the non-volatile memory 330.

In one example, the memory controller 310 can generate a status bit of "1" when the number of program pulses for the defined data region 332 is above the defined threshold and a status bit of "0" when the number of program pulses for the defined data region 332 is below the defined threshold. Therefore, when the status bit is equal to "1," the memory controller 310 can read the defined data region 332 and initiate the data recovery (if corrupted data 334 is detected) for the defined data region 332.

In one example, when the program pulse count for a particular data region 332 is above the defined threshold, the memory controller 310 can proactively read additional data regions 332 in the non-volatile memory 330 that are adjacent to the defined data region 332 in order to detect corrupted data 334 in the additional data regions 332. If the memory controller 310 detects corrupted data 334 in the additional data regions 332, then the memory controller 310 can perform data recovery in the additional data regions 332.

In one configuration, after data is copied from the memory buffer 320 to the non-volatile memory 330, the memory controller 310 can discard the data in the memory buffer 320 when the number of program pulses for a particular data region 332 is below the defined threshold (i.e., no reading of the data region 332 in order to detect corrupted data 334 is performed). In another configuration, the memory controller 310 can discard data in the memory buffer 320 after the defined data regions 332 (that are associated with the high program pulse count) in the non-volatile memory 330 are read, and no corrupted data 334 is detected in the defined data regions 332 in the non-volatile memory 330. In other words, the data can be stored in the memory buffer 320 until the high pulse warning detection feature is completely executed, and at that point, the data can be deleted from the memory buffer 320. In yet another configuration, the memory controller 310 can discard data in the memory buffer 320 after the uncorrupted data 322 is written over the corrupted data 334 in the non-volatile memory 330 in response to detection of the corrupted data 334 in the non-volatile memory 330. In some embodiments additional data verification can be made by the memory controller 310 to check the newly rewritten data and confirm that there are no errors therein before the data in the memory buffer is discarded. Any number of verifications can be made and/or repeated until it is confirmed that the data in the data region 332 is correct.

In one example, by using the high pulse warning detection feature and/or the read back feature, an XOR protocol for performing data recovery in the non-volatile memory 330 can be eliminated. However, an XOR protocol can still be implemented in the memory buffer 320 in order to protect data in the memory buffer 320. While the XOR protocol can consume 12-16 GB for the non-volatile memory 330, since the memory buffer 320 has a much smaller capacity in relation to the non-volatile memory 330, the XOR protocol for the memory buffer 320 can be approximately several hundred megabytes (MB).

Figure 4:
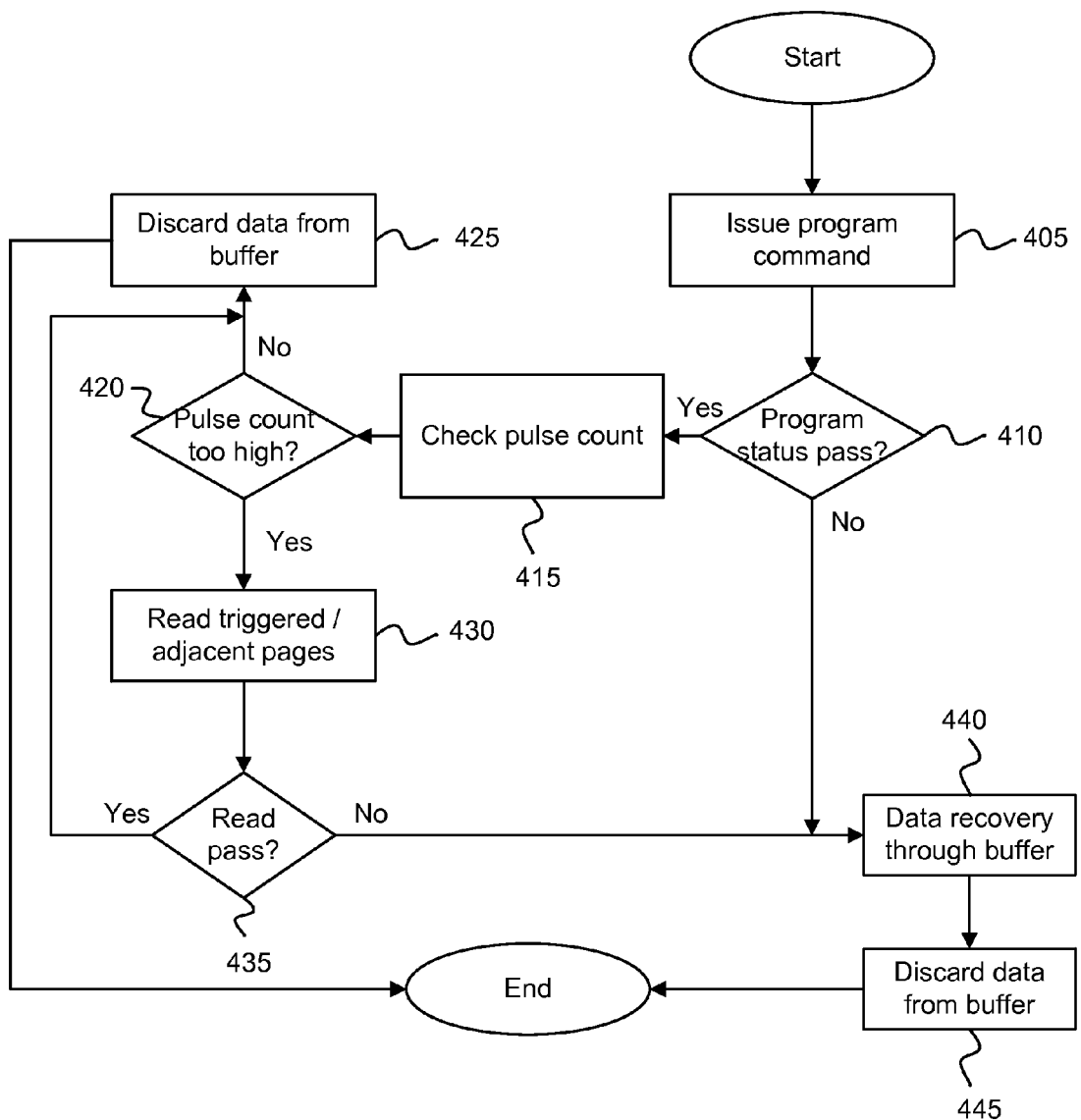
FIG. 4 illustrates a technique to perform data recovery in a data storage device in accordance with an example embodiment.

FIG. 4 illustrates an exemplary technique to perform data recovery in a data storage device (e.g., NAND memory device). The data storage device can include a memory buffer, a non-volatile memory, and a memory controller that writes data from the memory buffer to the non-volatile memory. In step 405, a program command can be issued by, for example, an application-specific integrated circuit (ASIC) of the memory controller in the data storage device. In step 410, the memory controller can determine whether a program status indicates a pass. If the program status does not indicate a pass, then in step 440, data can be recovered through a memory buffer. The memory buffer can comprise non-volatile memory (e.g., NAND) or volatile memory, such as dynamic random-access memory (DRAM). After data is recovered through the memory buffer, then in step 445, the data can be discarded from the memory buffer. Reverting back to step 410, if the program status indicates a pass, then in step 415, the memory controller can check a pulse count for a particular data region (e.g., page). In one example, the memory controller can check the pulse count using a program pulse counter.

In step 420, the memory controller can determine whether the program pulse count for the particular data region exceeds a defined threshold. If the program pulse count does not exceed the defined threshold, then in step 425, data can be discarded from the memory buffer. If the program pulse count exceeds the defined threshold, then in step 430, the memory controller can read the particular data region (e.g., page) that has been triggered by the high program pulse count. In addition, in step 430, the memory controller can read additional data regions (e.g., pages) that are adjacent to the data region. In step 435, the memory controller can determine whether the read of the triggered data regions and/or adjacent data regions has passed. In other words, the memory controller can determine whether the triggered data regions and/or adjacent data regions include corrupted data. If the read has passed (i.e., no corrupted data is detected), then in step 424, data can be discarded from the memory buffer. If the read does not pass (i.e., corrupted data is detected), then in step 440, data can be recovered through a memory buffer, and then in step 445, the data can be discarded from the memory buffer.

FIG. 5 illustrates exemplary storage savings when an XOR protocol is not utilized to perform data recovery in a non-volatile memory of a data storage device (e.g., a client SSD). As shown in the first table 510, inclusion of the XOR protocol can consume approximately 16 gigabytes (GB) of storage in the data storage device. Due to the storage of the XOR protocol, the available capacity for the user can be approximately 243.2 GB. However, by implementation of the read back feature and the high pulse warning detection feature, the XOR protocol can be eliminated, which can result in storage savings of approximately 16 GB. As a result, as shown in the second table 520, the available capacity for the user can be approximately 260.4 GB. Thus, the elimination of the XOR protocol in the non-volatile memory can result in significant storage savings, which can benefit the user of the data storage device.

Figure 6:
FIG. 6 is a table outlining a plurality of potential failure scenarios and corresponding recovery flows for a data storage device in accordance with an example embodiment.

FIG. 6 is shown an exemplary table 600 outlining a plurality of potential failure scenarios and corresponding recovery flows for a data storage device. As shown in the table 600, a plurality of solid state drive (SSD) operations can be performed from the perspective of the client SSD, such as write and read. Traditional data recovery techniques can be used in combination with the read back feature and the high pulse warning detection feature in order to provide a data recovery solution that does not rely on the XOR protocol to perform data recovery in the non-volatile memory. However, in the present technology, an XOR protocol can be utilized to perform data recovery in the memory buffer. In one example, the non-volatile memory can utilize TLC NAND and the memory buffer can utilize SLC NAND.

In SSD activities 1 and 2, data can be written from a host to a memory buffer (e.g., an SLC NAND region). If a sudden power loss occurs, then a crash recovery process can be performed. If the program fails, then data recovery can be performed via a technique with low memory buffer Defects per Million (DPM) or an XOR protocol in the memory buffer. In SSD activities 3 and 4, data can be written from the memory buffer (e.g., an SLC NAND region) to a media eviction region (e.g., a TLC NAND region in the non-volatile memory). Media eviction can refer to the process by which old or relatively unused is dropped from the memory buffer. If a sudden power loss occurs or the program fails, then data can be recovered from the memory buffer. In SSD activities 5 and 6, data can be written from the memory buffer (e.g., an SLC NAND region) to a memory buffer defragmentation region (e.g., a TLC NAND region in the non-volatile memory). If a sudden power loss occurs or the program fails, then data can be recovered from the memory buffer. In SSD activities 7 and 8, data can be written from a media region (e.g., a TLC NAND region in the non-volatile memory) to a media defragmentation region (e.g., a TLC NAND region in the non-volatile memory). If a sudden power loss occurs or the program fails, then data can be recovered from a media source.

In SSD activity 9, the host can read data from the memory buffer (e.g., an SLC NAND region). If the read fails, then data recovery can be performed via a technique with low memory buffer DPM or an XOR protocol in the memory buffer. In SSD activity 10, the host can read data from the media region (e.g., a TLC NAND region in the non-volatile memory). If the read fails, then data recovery can be performed using the read back feature and/or the high pulse warning detection feature, as described earlier. In SSD activity 11, a memory buffer defragmentation region or eviction region (e.g., an SLC region) can read data from the memory buffer (e.g., an SLC NAND region). If the read fails on origin, then data recovery can be performed via a technique with low memory buffer DPM or an XOR protocol in the memory buffer. In SSD activity 12, a media defragmentation region (e.g., a TLC NAND region in the non-volatile memory) can read data from the media region (e.g., a TLC NAND region in the non-volatile memory). If the read fails on origin, then data recovery can be performed using the read back feature and/or the high pulse warning detection feature, as described earlier.

Figure 7:
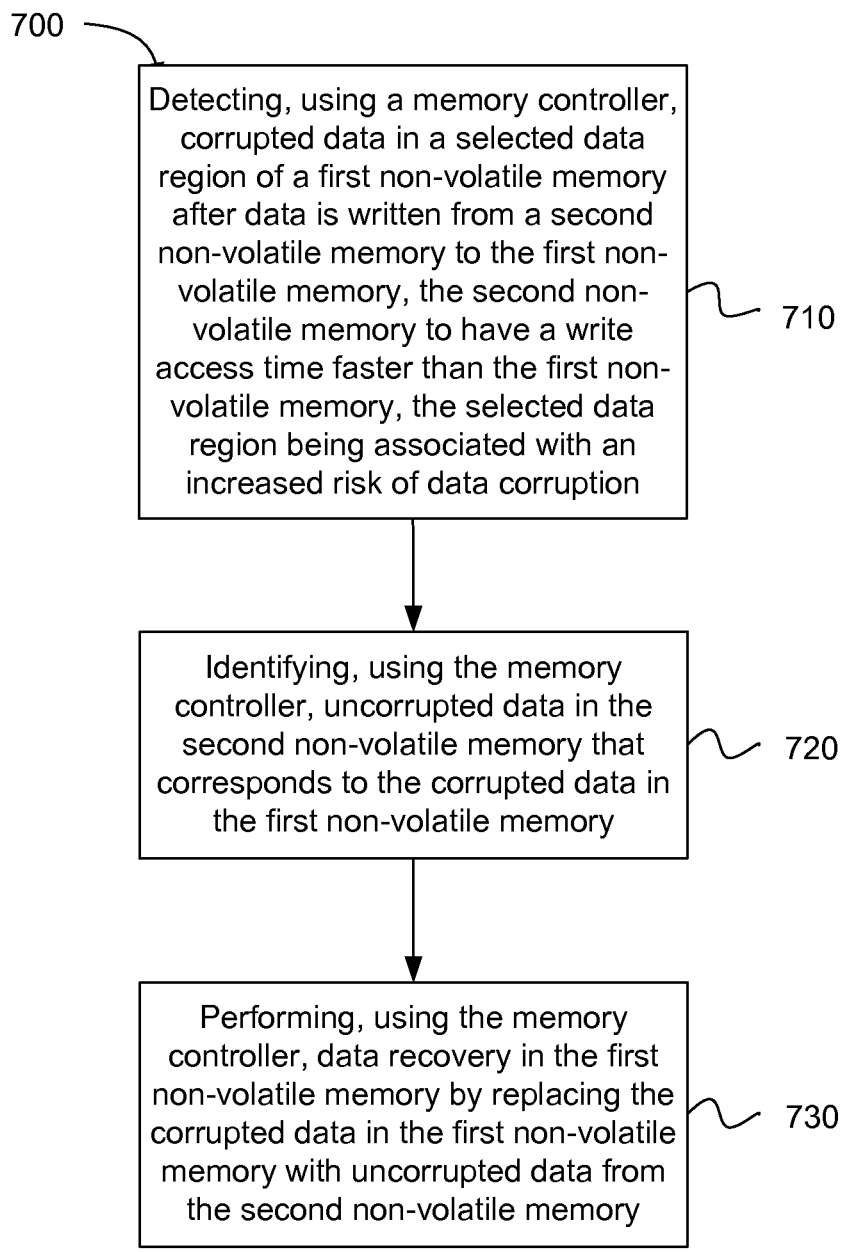
FIG. 7 depicts a flowchart of a method for performing data recovery in accordance with an example embodiment.

Another example provides a method 700 for performing data recovery in a non-volatile memory storage device, as shown in the flow chart in FIG. 7. The method can be executed as instructions on a machine, where the instructions are included on at least one computer readable medium or one non-transitory machine readable storage medium. The method can include the operation of detecting, using a memory controller, corrupted data in a selected data region of a first non-volatile memory after data is written from a second non-volatile memory to the first non-volatile memory, the second non-volatile memory to have a write access time faster than the first non-volatile memory, the selected data region being associated with an increased risk of data corruption, as in block 710. The method can include the operation of identifying, using the memory controller, uncorrupted data in the second non-volatile memory that corresponds to the corrupted data in the first non-volatile memory, as in block 720. The method can include the operation of performing, using the memory controller, data recovery in the first non-volatile memory by replacing the corrupted data in the first non-volatile memory with uncorrupted data from the second non-volatile memory, as in block 730.

Figure 8:
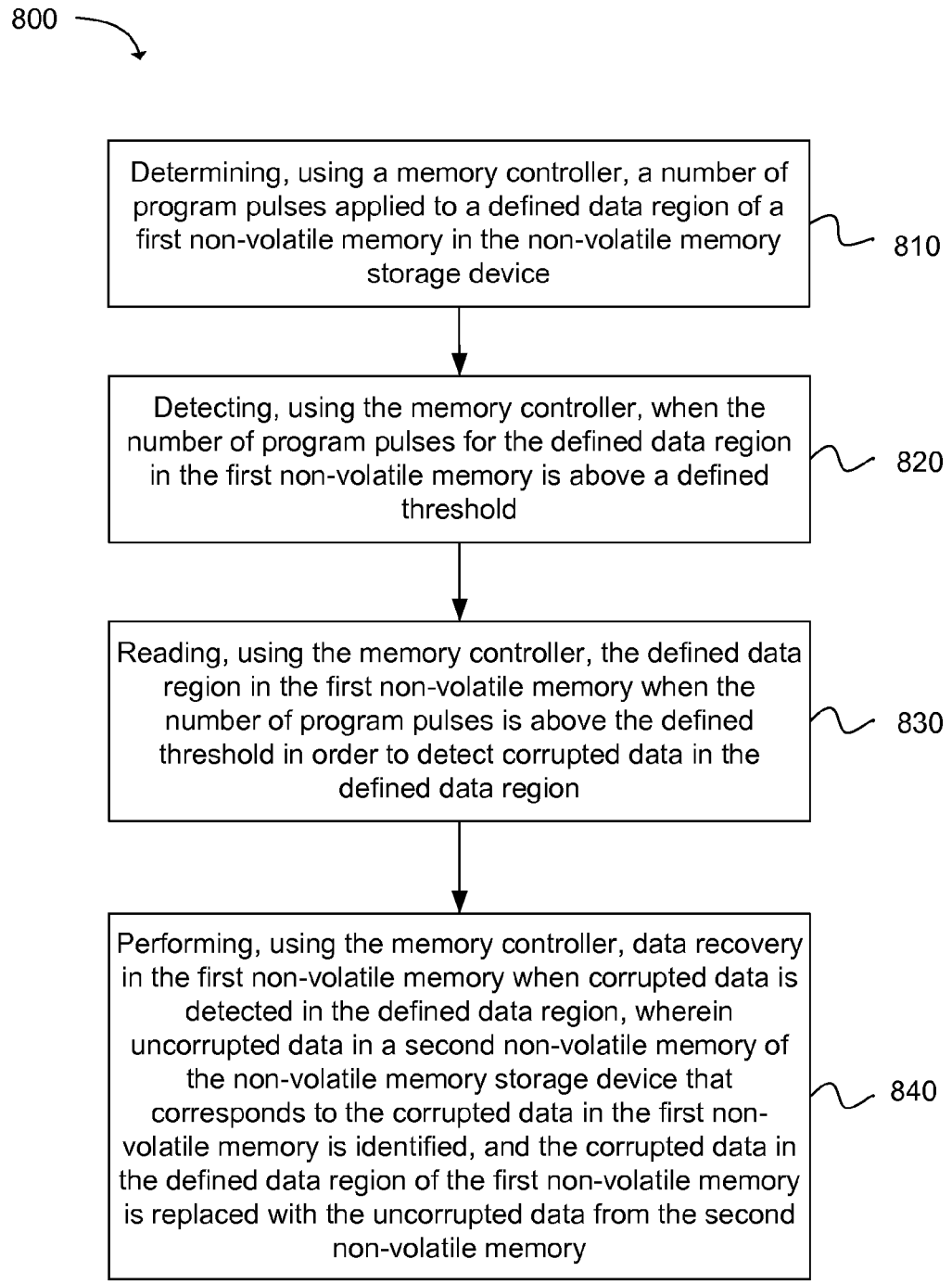
FIG. 8 depicts a flowchart of a method for performing data recovery in accordance with an example embodiment.

Another example provides a method 800 for performing data recovery in a non-volatile memory storage device, as shown in the flow chart in FIG. 8. The method can be executed as instructions on a machine, where the instructions are included on at least one computer readable medium or one non-transitory machine readable storage medium. The method can include the operation of determining, using a memory controller, a number of program pulses applied to a defined data region of a first non-volatile memory in the non-volatile memory storage device, as in block 810. The method can include the operation of detecting, using the memory controller, when the number of program pulses for the defined data region in the first non-volatile memory is above a defined threshold, as in block 820. The method can include the operation of reading, using the memory controller, the defined data region in the first non-volatile memory when the number of program pulses is above the defined threshold in order to detect corrupted data in the defined data region, as in block 830. The method can include the operation of performing, using the memory controller, data recovery in the first non-volatile memory when corrupted data is detected in the defined data region, wherein uncorrupted data in a second non-volatile memory of the non-volatile memory storage device that corresponds to the corrupted data in the first non-volatile memory is identified, and the corrupted data in the defined data region of the first non-volatile memory is replaced with the uncorrupted data from the second non-volatile memory, as in block 840.

Figure 9:
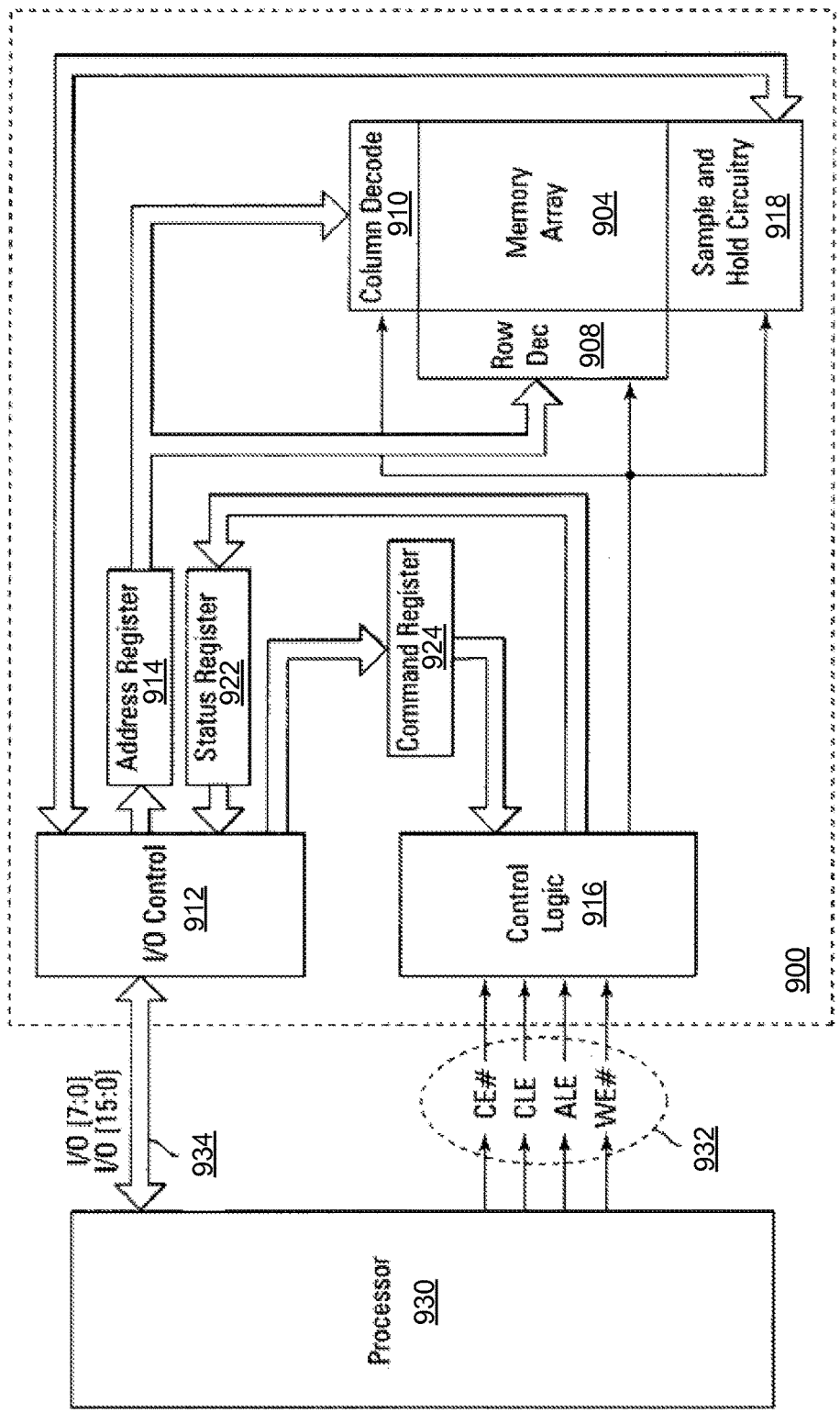
FIG. 9 illustrates a memory system diagram in accordance with an example embodiment.

FIG. 9 is a simplified block diagram of a memory device 900 according to an invention embodiment, and on which various methods can be practiced. Memory device 900 includes an array of memory cells 904 arranged in rows and columns. Although the various embodiments will be described primarily with reference to NAND memory arrays, the various embodiments are not limited to a specific architecture of the memory array 904. Some examples of other specific array architectures include NOR arrays, AND arrays, PCM arrays, and virtual ground arrays. In general, however, the embodiments described herein are adaptable to any array architecture permitting generation of a data signal indicative of state of a memory cell, such as through a the threshold voltage.

A row decode circuitry 908 and a column decode circuitry 910 are provided to decode address signals provided to the memory device 900. Address signals are received and decoded to access memory array 904. Memory device 900 also includes input/output (I/O) control circuitry 912 to manage input of commands, addresses and data to the memory device 900 as well as output of data and status information from the memory device 900. An address register 914 is coupled between I/O control circuitry 912 and row decode circuitry 908 and column decode circuitry 910 to latch the address signals prior to decoding. A command register 924 is coupled between I/O control circuitry 912 and control logic 916 to latch incoming commands. Control logic 916 controls access to the memory array 904 in response to the commands and generates status information for an external processor 930 (also known as a memory controller as described earlier). The control logic 916 is coupled to row decode circuitry 908 and column decode circuitry 910 to control the row decode circuitry 908 and column decode circuitry 910 in response to the addresses.

Control logic 916 can be coupled to a sample and hold circuitry 918. The sample and hold circuitry 918 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 918 can further provide for amplification and/or buffering of the sampled signal to provide a stronger data signal to an external device.

The handling of analog data signals can take an approach where charge levels generated are stored on capacitors. A charge can be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 912 for output from the memory device, in the case of a read operation, or used for comparison during one or more verify operations in programming the memory device. It is noted that the I/O control circuitry 912 could optionally include analog-to-digital conversion functionality and digital-to-analog conversion (DAC) functionality to convert read data from an analog data signal to a digital bit pattern and to convert write data from a digital bit pattern to an analog signal such that the memory device 900 could be adapted for communication with either an analog or digital data interface.

During a programming operation, target memory cells of the memory array 904 are programmed until voltages indicative of their Vt levels match the levels held in the sample and hold circuitry 918. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 918 for transfer to an external processor (not shown in FIG. 9) either directly as analog signals or as digitized representations of the analog signals depending upon whether ADC/DAC functionality is provided external to, or within, the memory device.

Threshold voltages of cells can be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 918 can include caching, i.e., multiple storage locations for each data value, such that the memory device 900 can be reading a next data value while passing a first data value to the external processor, or receiving a next data value while writing a first data value to the memory array 904. A status register 922 is coupled between I/O control circuitry 912 and control logic 916 to latch the status information for output to the external processor.

Memory device 900 receives control signals at control logic 916 over a control link 932. The control signals can include a chip enable CE#, a command latch enable CLE, an address latch enable ALE, and a write enable WE#. Memory device 900 can receive commands (in the form of command signals), addresses (in the form of address signals), and data (in the form of data signals) from an external processor over a multiplexed input/output (I/O) bus 934 and output data to the external processor over I/O bus 934.

In a specific example, commands are received over input/output (I/O) pins [7:0] of I/O bus 934 at I/O control circuitry 912 and are written into command register 924. The addresses are received over input/output (I/O) pins [7:0] of bus 934 at I/O control circuitry 912 and are written into address register 914. The data can be received over input/output (I/O) pins [7:0] for a device capable of receiving eight parallel signals, or input/output (I/O) pins [15:0] for a device capable of receiving sixteen parallel signals, at I/O control circuitry 912 and are transferred to sample and hold circuitry 918. Data also can be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 9 has been simplified to help focus on the embodiments of the disclosure.

While FIG. 9 has been described with respect to sample and hold circuitry 918, it should be understood that the control logic 916 could be coupled to data latches instead of sample and hold circuitry 918 without departing from the scope of the disclosure. During a write operation, target memory cells of the memory array 904 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 9 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 934. Because the data signals represent bit patterns instead of individual bits, serial communication of an 8-bit data signal could be as efficient as parallel communication of eight signals representing individual bits.

Figure 10:
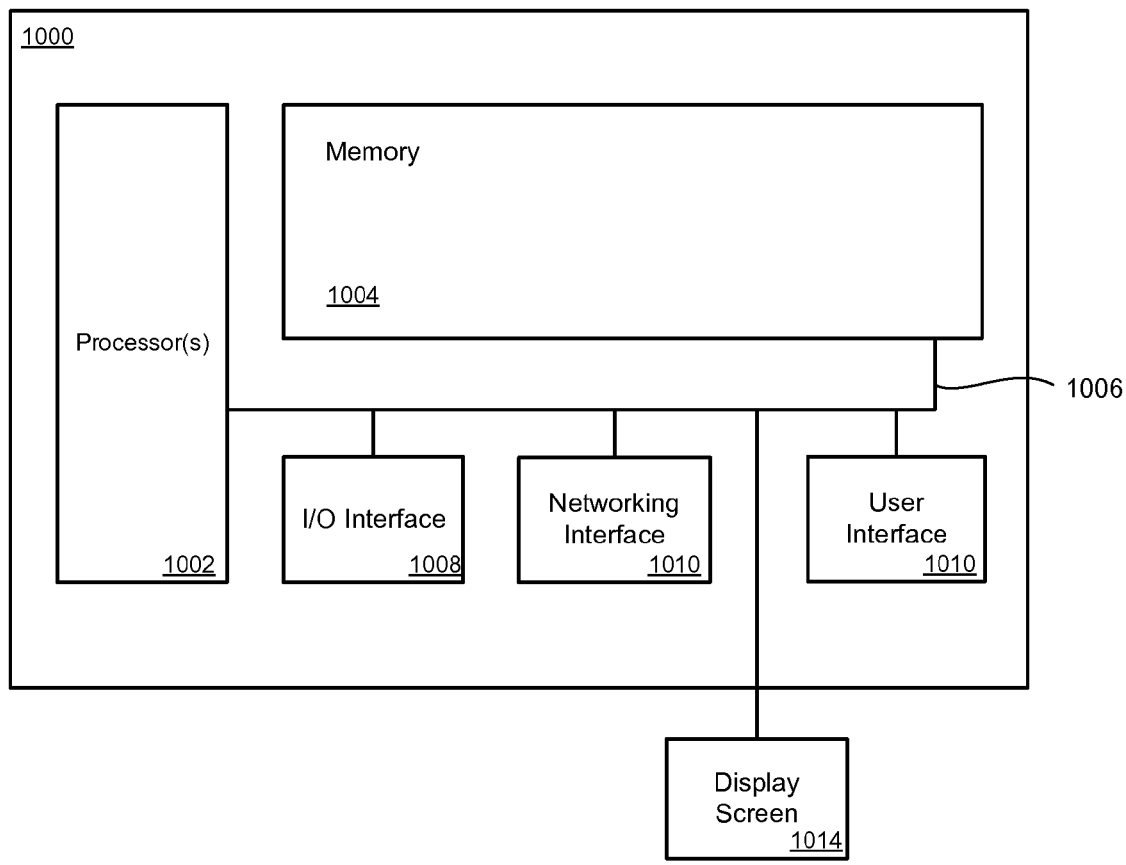
FIG. 10 illustrates a computing system that includes a data storage device in accordance with an example embodiment.

FIG. 10 illustrates a general computing system or device 1000 that can be employed in the present technology. The computing system 1000 can include a processor 1002 in communication with a memory 1004. The memory 1004 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The computing system or device 1000 additionally includes a local communication interface 1006 for connectivity between the various components of the system. For example, the local communication interface 1006 can be a local data bus and/or any related address or control busses as may be desired.

The computing system or device 1000 can also include an I/O (input/output) interface 1008 for controlling the I/O functions of the system, as well as for I/O connectivity to devices outside of the computing system 1000. A network interface 1010 can also be included for network connectivity. The network interface 1010 can control network communications both within the system and outside of the system. The network interface can include a wired interface, a wireless interface, a Bluetooth interface, optical interface, and the like, including appropriate combinations thereof. Furthermore, the computing system 1000 can additionally include a user interface 1012, a display device 1014, as well as various other components that would be beneficial for such a system.

The processor 1002 can be a single or multiple processors, and the memory 1004 can be a single or multiple memories. The local communication interface 1006 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. Anon-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, dvd players, hvac controllers, light switches, and the like.

EXAMPLES

The following examples pertain to specific invention embodiments and point out specific features, elements, or steps that can be used or otherwise combined in achieving such embodiments.

In one example there is provided an apparatus comprising:
  a first non-volatile memory;
  a second non-volatile memory, the second non-volatile memory to have a write access time faster than the first non-volatile memory; and
  a memory controller having circuitry configured to:
    detect corrupted data in a selected data region in the first non-volatile memory,
    identify uncorrupted data in the second non-volatile memory that corresponds to the corrupted data in the first non-volatile memory; and
    perform data recovery in the first non-volatile memory by replacing the corrupted data in the first non-volatile memory with uncorrupted data from the second non-volatile memory.

In one example of an apparatus, the data region in the first non-volatile memory is associated with an increased risk of data corruption.

In one example of an apparatus, the data region in first non-volatile memory is associated with an increased risk of data corruption in comparison to another data region in the first non-volatile memory of the apparatus.

In one example of an apparatus, the selected data region that is associated with the increased risk of data corruption is previously identified based on development and testing information for a memory device or a type of memory device.

In one example of an apparatus, the selected data region that is associated with the increased risk of data corruption is one or more edge pages in a data block of the first non-volatile memory, wherein a failure rate associated with the one or more edge pages is above a defined threshold.

In one example of an apparatus, the selected data region that is associated with the increased risk of data corruption has received a number of program pulses above a defined threshold.

In one example of an apparatus, the number of program pulses received by the selected data region is identified after data is written from the second non-volatile memory to the selected data region.

In one example of an apparatus, the data in the second non-volatile memory is discarded after no corrupted data is detected in the selected data region in the first non-volatile memory.

In one example of an apparatus, the first non-volatile memory utilizes three bits per cell (TLC) of non-volatile storage media.

In one example of an apparatus, the second non-volatile memory is a memory buffer that utilizes a single bit per cell (SLC) of non-volatile storage media.

In one example of an apparatus, the first non-volatile memory utilizes multiple bits per cell (MLC) of non-volatile storage media and the second non-volatile memory is a memory buffer that utilizes a single bit per cell (SLC) of non-volatile storage media.

In one example of an apparatus, the first non-volatile memory and the second non-volatile memory utilize at least one of NAND or phase change memory (PCM).

In one example of an apparatus, the memory device is a solid state storage drive.

In one example there is provided, a data storage system operable to perform data recovery, the data storage system comprising:
- a first non-volatile memory;
- a second non-volatile memory, the second non-volatile memory to have a write access time faster than the first non-volatile memory; and
- a memory controller having circuitry configured to:
  - detect corrupted data in an identified data region; and
  - recover data in the first non-volatile memory by replacing the corrupted data in the first non-volatile memory with corresponding uncorrupted data from the second non-volatile memory.

In one example of a data storage system, the identified data region in the first non-volatile memory has an increased risk of data corruption.

In one example of a data storage system, the data region has a risk of corruption that is higher than another data region in the data storage system.

In one example of a data storage system, the data region having the increased risk of data corruption is identified based on previous development and testing information for a memory system or a type of memory system.

In one example of a data storage system, the selected data region having an increased risk of data corruption is one or more edge pages in a data block of the first non-volatile memory having a failure rate above a defined threshold.

In one example of a data storage system, the selected data region having an increased risk of data corruption has received a number of program pulses above a defined threshold.

In one example of a data storage system, the memory controller's circuitry is configured to:
- identify the number of program pulses applied to a defined data region of the first non-volatile memory after data is written from the second non-volatile memory to the defined data region of the first non-volatile memory;
- detect when the number of program pulses applied to the defined data region is above a defined threshold;
- read the defined data region in the first non-volatile memory when the number of program pulses is above the defined threshold in order to detect corrupted data in the defined data region; and
- perform data recovery in the first non-volatile memory when corrupted data is detected in the defined data region by identifying uncorrupted data in the second non-volatile memory that corresponds to the corrupted data in the first non-volatile memory and replacing the corrupted data with the uncorrupted data.

In one example of a data storage system, the memory controller is further configured to:
- read additional data regions in the first non-volatile memory that are adjacent to the identified data region in order to detect corrupted data in the additional data regions; and
- perform data recovery in the first non-volatile memory when corrupted data is detected in the additional data regions.

In one example of a data storage system, data from the second non-volatile memory is discarded when no corrupted data is detected in the identified data region of the first non-volatile memory.

In one example of a data storage system, the identified data region includes defined pages in a data block of the first non-volatile memory.

In one example of a data storage system, the memory controller is further configured to generate a status bit of "1" when the number of program pulses for the defined data region is above the defined threshold and a status bit of "0" when the number of program pulses for the defined data region is below the defined threshold, wherein the memory controller is configured to initiate the data recovery when the status bit is equal to "1".

In one example of a data storage system, the memory controller is configured to use a counter to determine the number of program pulses that are applied to the defined data region of the first non-volatile memory.

In one example of a data storage system, the first non-volatile memory utilizes three bits per cell (TLC) of non-volatile storage media.

In one example of a data storage system, the second non-volatile memory is a memory buffer that utilizes a single bit per cell (SLC) of non-volatile storage media.

In one example of a data storage system, the first non-volatile memory utilizes multiple bits per cell (MLC) of non-volatile storage media and the second non-volatile memory is a memory buffer that utilizes a single bit per cell (SLC) of non-volatile storage media.

In one example of a data storage system, the first non-volatile memory and the second non-volatile memory utilize at least one of NAND or phase change memory (PCM).

In one example of a data storage system, the data storage system is a solid state storage drive.

In one example there is provided, a method for performing data recovery in a non-volatile memory storage device, the method comprising:
- detecting, using a memory controller, corrupted data in a selected data region of a first non-volatile memory after data is written from a second non-volatile memory to the first non-volatile memory, the second non-volatile memory to have a write access time faster than the first non-volatile memory, the selected data region being associated with an increased risk of data corruption;
- identifying, using the memory controller, uncorrupted data in the second non-volatile memory that corresponds to the corrupted data in the first non-volatile memory; and
- performing, using the memory controller, data recovery in the first non-volatile memory by replacing the corrupted data in the first non-volatile memory with uncorrupted data from the second non-volatile memory.

In one example of a method for performing data recovery, the selected data region is associated with an increased risk of data corruption.

In one example, of a method for performing data recovery, the selected data region has an increased risk of data corruption compared to another data region in the memory storage device.

In one example of a method for performing data recovery, the method further comprises programming the data in the first non-volatile memory by moving the data from the second non-volatile memory to the first non-volatile memory.

In one example of a method for performing data recovery, the selected data region that is associated with the increased risk of data corruption is previously identified based on development and testing information for the non-volatile memory storage device or the type of non-volatile memory storage device.

In one example of a method for performing data recovery, the selected data region is one or more edge pages in a data block of the first non-volatile memory, wherein a failure rate associated with the one or more edge pages is above a defined threshold.

In one example of a method for performing data recovery, the selected data region is one or more predefined pages in a data block of the first non-volatile memory, wherein a failure rate associated with the predefined pages is above a defined threshold.

In one example of a method for performing data recovery, the method further comprises discarding the data in the second non-volatile memory after no corrupted data is detected in the selected data region in the first non-volatile memory.

In one example of a method for performing data recovery, the first non-volatile memory utilizes multiple bits per cell (MLC) of non-volatile storage media and the second non-volatile memory is a memory buffer that utilizes a single bit per cell (SLC) of non-volatile storage media.

In one example, there is provided, a method for performing data recovery in a non-volatile memory storage device, the method comprising:
  determining, using a memory controller, a number of program pulses applied to a defined data region of a first non-volatile memory in the non-volatile memory storage device;
  detecting, using the memory controller, when the number of program pulses for the defined data region in the first non-volatile memory is above a defined threshold;
  reading, using the memory controller, the defined data region in the first non-volatile memory when the number of program pulses is above the defined threshold in order to detect corrupted data in the defined data region; and
  performing, using the memory controller, data recovery in the first non-volatile memory when corrupted data is detected in the defined data region, wherein uncorrupted data in a second non-volatile memory of the non-volatile memory storage device that corresponds to the corrupted data in the first non-volatile memory is identified, and the corrupted data in the defined data region of the first non-volatile memory is replaced with the uncorrupted data from the second non-volatile memory.

In one example of a method for performing data recovery, the method further comprises:
  reading additional data regions in the first non-volatile memory that are adjacent to the defined data region in order to detect corrupted data in the additional data regions; and
  performing data recovery in the first non-volatile memory when corrupted data is detected in the additional data regions.

In one example of a method for performing data recovery, the method further comprises discarding the data in the second non-volatile memory after no corrupted data is detected in the defined data region of the first non-volatile memory.

In one example of a method for performing data recovery, the defined data region includes defined pages in a data block of the first non-volatile memory.

In one example of a method for performing data recovery, the method further comprises generating a status bit of "1" when the number of program pulses for the defined data region is above the defined threshold and a status bit of "0" when the number of program pulses for the defined data region is below the defined threshold, wherein the data recovery is initiated when the status bit is equal to "1".

In one example of a method for performing data recovery, a counter in the non-volatile memory storage device is used to determine the number of program pulses that are applied to the defined data region of the first non-volatile memory.

In one example of a method for performing data recovery, the first non-volatile memory utilizes multiple bits per cell (MLC) of non-volatile storage media and the second non-volatile memory is a memory buffer that utilizes a single bit per cell (SLC) of non-volatile storage media.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. An apparatus comprising:
  a first non-volatile memory;
  a second non-volatile memory, the second non-volatile memory to have a write access time faster than the first non-volatile memory; and
  a memory controller having circuitry configured to:
    detect data in a selected data region in the first non-volatile memory as corrupted data by detecting, after the data has been programmed to the selected data region, a number of program pulses needed to program the data to the selected data region above a defined program pulse threshold, said selected data region being associated with an increased risk of data corruption;
    identify uncorrupted data in the second non-volatile memory that corresponds to the corrupted data in the first non-volatile memory; and
    perform data recovery in the first non-volatile memory by replacing the corrupted data in the first non-volatile memory with the uncorrupted data from the second non-volatile memory.

2. The apparatus of claim 1, wherein the selected data region that is associated with the increased risk of data corruption is previously identified based on development and testing information for a memory device or a type of memory device.

3. The apparatus of claim 1, wherein the selected data region that is associated with the increased risk of data corruption is one or more edge pages in a data block of the first non-volatile memory, wherein a failure rate associated with the one or more edge pages is above a defined threshold.

4. The apparatus of claim 1, wherein the number of program pulses above the defined program pulse threshold needed to program the data to the selected data region is identified after data is written from the second non-volatile memory to the selected data region.

5. The apparatus of claim 1, wherein the data in the second non-volatile memory is discarded after no corrupted data is detected in the selected data region in the first non-volatile memory.

6. The apparatus of claim 1, wherein the first non-volatile memory utilizes multiple bits per cell (MLC) of non-volatile storage media and the second non-volatile memory is a memory buffer that utilizes a single bit per cell (SLC) of non-volatile storage media.

7. The apparatus of claim 1, wherein the first non-volatile memory and the second non-volatile memory utilize at least one of NAND or phase change memory (PCM).

8. A data storage system operable to perform data recovery, the data storage system comprising:
a first non-volatile memory;
a second non-volatile memory, the second non-volatile memory to have a write access time faster than the first non-volatile memory; and
a memory controller having circuitry configured to:
select a data region in the first non-volatile memory having an increased risk of data corruption;
detect data in the selected data region as corrupted data by detecting, after the data has been programmed to the selected data region, a number of program pulses needed to write the data to the selected data region that is above a defined program pulse threshold; and
replace the corrupted data in the first non-volatile memory with corresponding uncorrupted data from the second non-volatile memory.

9. The data storage system of claim 8, wherein the selected data region having the increased risk of data corruption is identified based on previous development and testing information for the data storage system or a type of data storage system.

10. The data storage system of claim 8, wherein the memory controller's circuitry is further configured to:
write the data to the second non-volatile memory;
write the data from the second non-volatile memory to the selected data region in the first non-volatile memory;
identify the number of program pulses needed to write the data to the selected data region of the first non-volatile memory after the data is written from the second non-volatile memory;
identify the data as corrupted data if the number of program pulses needed to write the data to the selected data region is above the defined program pulse threshold; and
rewrite, if the data is corrupted data, the data in the second non-volatile memory that corresponds to the corrupted data to the first non-volatile memory to replace the corrupted data.

11. The data storage system of claim 8, wherein the memory controller is further configured to:
read additional data regions in the first non-volatile memory that are adjacent to the selected data region in order to detect corrupted data in the additional data regions; and
perform data recovery in the first non-volatile memory when corrupted data is detected in the additional data regions.

12. The data storage system of claim 8, wherein the memory controller is further configured to generate a status bit of "1" when the number of program pulses for the selected data region is above the defined threshold and a status bit of "0" when the number of program pulses for the selected data region is below the defined threshold, wherein the memory controller is configured to initiate the data recovery when the status bit is equal to "1".

13. The data storage system of claim 8, wherein the memory controller is configured to use a counter to determine the number of program pulses needed to write the data to the selected data region of the first non-volatile memory.

14. The data storage system of claim 8, wherein the first non-volatile memory utilizes multiple bits per cell (MLC) of non-volatile storage media and the second non-volatile memory is a memory buffer that utilizes a single bit per cell (SLC) of non-volatile storage media.

15. A method for performing data recovery in a non-volatile memory storage device, the method comprising:
detecting, using a memory controller, data in a selected data region of a first non-volatile memory as corrupted data after the data is written from a second non-volatile memory to the first non-volatile memory by detecting, after the data has been programmed to the selected data region, a number of program pulses needed to program the data to the selected data region above a defined threshold, the second non-volatile memory to have a write access time faster than the first non-volatile memory, and the selected data region being associated with an increased risk of data corruption;
identifying, using the memory controller, uncorrupted data in the second non-volatile memory that corresponds to the corrupted data in the selected region of the first non-volatile memory; and
performing, using the memory controller, data recovery in the first non-volatile memory by replacing the corrupted data in the selected data region with the uncorrupted data from the second non-volatile memory.

16. The method of claim 15, further comprising programming the data in the selected region of the first non-volatile memory by copying the data from the second non-volatile memory to the selected region of the first non-volatile memory.

17. The method of claim 15, wherein the selected data region that is associated with the increased risk of data corruption is previously identified based on development and testing information for the non-volatile memory storage device or a type of non-volatile memory storage device.

18. The method of claim 15, wherein the selected data region is one or more edge pages in a data block of the first non-volatile memory, wherein a failure rate associated with the one or more edge pages is above a defined threshold.

19. The method of claim 15, wherein the selected data region is one or more predefined pages in a data block of the first non-volatile memory, wherein a failure rate associated with the predefined pages is above a defined threshold.

20. The method of claim 15, further comprising discarding the data in the second non-volatile memory after no corrupted data is detected in the selected data region in the first non-volatile memory.

21. A method for performing data recovery in a non-volatile memory storage device, the method comprising:
determining, using a memory controller, a number of program pulses needed to program data to a defined data region of a first non-volatile memory in the non-volatile memory storage device after the data has been programed to the defined data region;
detecting, using the memory controller, when the number of program pulses needed to program the data to the defined data region in the first non-volatile memory is above a defined program pulse threshold;
reading, using the memory controller, the data from the defined data region in the first non-volatile memory when the number of program pulses needed to program data is above the defined program pulse threshold in order to detect corrupted data; and
performing, using the memory controller, data recovery in the first non-volatile memory when corrupted data is detected in the defined data region, wherein uncorrupted data in a second non-volatile memory of the non-volatile memory storage device that corresponds to the corrupted data in the first non-volatile memory is identified, and the corrupted data in the defined data region of the first non-volatile memory is replaced with the uncorrupted data from the second non-volatile memory.

22. The method of claim 21, further comprising:
reading additional data regions in the first non-volatile memory that are adjacent to the defined data region in order to detect corrupted data in the additional data regions; and
performing data recovery in the first non-volatile memory when corrupted data is detected in the additional data regions.

23. The method of claim 21, further comprising generating a status bit of "1" when the number of program pulses needed to program data in the defined data region is above the defined program pulse threshold and a status bit of "0" when the number of program pulses needed to program data in the defined data region is below the defined program pulse threshold, wherein the data recovery is initiated when the status bit is equal to "1".

* * * * *